United States Patent [19]
Arai et al.

[11] Patent Number: 5,196,173
[45] Date of Patent: * Mar. 23, 1993

[54] APPARATUS FOR PROCESS FOR GROWING CRYSTALS OF SEMICONDUCTOR MATERIALS

[75] Inventors: Yoshiaki Arai; Michio Kida; Naoki Ono; Kensho Sahira, all of Omiya, Japan

[73] Assignee: Mitsubishi Materials Corporation, Tokyo, Japan

[*] Notice: The portion of the term of this patent subsequent to Jun. 26, 2007 has been disclaimed.

[21] Appl. No.: 420,518

[22] Filed: Oct. 12, 1989

[30] Foreign Application Priority Data

Oct. 13, 1988 [JP] Japan .................. 63-257608

[51] Int. Cl.[5] .......................................... C30B 35/00
[52] U.S. Cl. ................................... 422/249; 422/248
[58] Field of Search ...................... 422/245, 248, 249; 156/617.1, DIG. 83, DIG. 115

[56] References Cited

U.S. PATENT DOCUMENTS

| | | | |
|---|---|---|---|
| 2,892,739 | 6/1959 | Rusler | 156/620.3 |
| 3,637,439 | 1/1972 | DeBie | 422/249 |
| 4,609,425 | 9/1986 | Mateika et al. | 156/DIG. 83 |
| 4,936,949 | 6/1990 | Kida et al. | 156/617.1 |
| 4,938,837 | 7/1990 | Tada et al. | 156/608 |
| 4,944,834 | 7/1990 | Tada et al. | 156/620.5 |

FOREIGN PATENT DOCUMENTS

| | | | |
|---|---|---|---|
| 219776 | 4/1987 | European Pat. Off. | |
| 293865 | 12/1988 | European Pat. Off. | |
| 47300 | 4/1980 | Japan | |
| 204895 | 11/1983 | Japan | |
| 0018634 | 5/1985 | Japan | 422/248 |
| 62-275088 | 11/1987 | Japan | |
| 248792 | 10/1988 | Japan | |
| 303894 | 12/1988 | Japan | |
| 83593 | 3/1989 | Japan | |
| 1072987 | 3/1989 | Japan | 422/249 |
| 939102 | 10/1963 | United Kingdom | |

OTHER PUBLICATIONS

English Translation of JP-62-275088, Tada et al., Nov. 30, 1992.
"Properties of Gap Single Crystals" *Journal of Electrochemical Society*, vol. 118, No. 2, Feb. 1971, pp. 307–312.

Primary Examiner—Michael Lewis
Assistant Examiner—Stephen G. Kalinchak
Attorney, Agent, or Firm—Cushman, Darby & Cushman

[57] ABSTRACT

In apparatuses for melting semiconductor material and growing single crystals of semiconductor material, the apparatus comprising:
(a) a furnace,
(b) a cylindrical double crucible assembly comprising an inner crucible in which single crystals of semiconductor material are grown at a vertical-concentric line thereof, the inner crucible having an upper part and a lower part, and an outer crucible in which melted semiconductor material is received, the outer crucible having the inner crucible disposed therein,
(c) a susceptor for supporting the outer crucible,
(d) rotating means for rotating the susceptor,
(e) a feed pipe for supplying starting material in the space formed between the inner and the outer crucibles,
(f) fluid-passage means for permitting the melted semiconductor material to flow between the inner and outer crucibles, the fluid-passage means being disposed at the lower part of the inner crucible, and wherein the inner crucible being set inside the outer crucible in a separable manner, the apparatus improved comprising:
(g) joining means for setting the inner crucible inside the outer crucible concentrically, the joining means being disposed inside the furnace, and
(h) engaging means for engaging the inner crucible and joining means detachably, the engaging means being disposed at the upper part of the inner crucible so as to engage a respective joining means.

6 Claims, 9 Drawing Sheets

APPARATUS FOR PROCESS FOR GROWING CRYSTALS OF SEMICONDUCTOR MATERIALS

BACKGROUND OF THE INVENTION

1. Field of the Invention

The field of the invention relates to an apparatus and to a process for growing crystals of semiconductor materials by using a double crucible which has an inner crucible and an outer crucible and in which the semiconductor material is continually supplied in a space formed between the inner and outer crucible.

2. Prior Art

In a batch-type apparatus for growing silicon single-crystal ingots, the quantity of melted silicon contained in a quartz crucible decreases as the silicon single crystal grows. As a result, qualities such as oxygen concentration, crystallization front, and dopant concentration are not uniform longitudinally within the crystalline ingot obtained by the batch-type apparatus. More specifically, the oxygen concentration in the crystal depends on the quantity of oxygen dissolved in the silicon melt, thereby varying as the silicon melt in the quartz crucible varies. In addition, since the quantity of the melt varies, the thermal distribution in the furnace fluctuates and the convection in the melt varies, so that the crystallization front varies. Furthermore, the dopant, such as phosphorus, boron, antimony, and the like, is generally added to the melt in order to control the electric conductivity of the single crystal. Since the segregation constant of such impurities is not identical to 1, the dopant concentration in the crystal differs as the crystal grows.

Thus, the quality of the single crystal ingot varies in the longitudinal direction, and therefore only a portion of the ingot has the desired qualities. Additionally, productivity has been low in such batch processes.

The approach to resolve the above disadvantages is to use a continually-supplied-type apparatus hitherto proposed wherein the single crystal ingot is grown while the quartz crucible is being charged with material. U.S. Pat. No. 2,892,739 and Japanese Patent Application First Publication "Kokai" No. 61-36197 describe one such apparatus which is the simplest crucible characterized by the combination of a continually-supplied-type crucible charging of the material and a two-wall-type crucible.

The above continually-supplied-type apparatus has, however, the following problems. First, although the melting point of the silicon is above 1420° C., the quartz of which the crucible is composed begins to soften at about 1100° C. As a result, the outer crucible supported by a graphite susceptor is not greatly deformed from its original shape greatly and the inner crucible may be deformed since the inner one is not supported sufficiently, so that the growing of the single crystal is adversely affected. Specifically, a great quantity of heat must be applied to the crucible in the initial stage of the pulling cycle in order to melt the material in the crucible, and the temperature in the furnace reaches the maximum at that time. Therefore, the deformation of the inner crucible is greatest at that time. FIGS. 1 to 4 illustrate conventional apparatuses each of which comprises a double quartz crucible. The double quartz crucible assembly is housed in a graphite susceptor 103 and comprises an inner crucible 101 and an outer crucible 102, and a resistance heater 104. The double crucible assembly is filled with a charge of unmelted starting silicon material 105 which, upon heating, forms silicon material melt 106. As shown in FIG. 1, the charge is heated by the heater 104 until it is melted thoroughly. Each inner crucible 101, however, is subjected to deformation as shown in FIGS. 2 and 4, respectively, as the silicon material is melted.

In addition, since quartz has a high heat-insulating effect, the temperature is lower on the inner side of the inner crucible than on the outer side thereof. This may be advantageous during the growth of crystals since the silicon material introduced between the inner and outer crucibles can be melted efficiently, but it is disadvantageous when melting the silicon material initially fed in the crucible since the inner crucible itself prevents the heat generated by the heater from being transferred to its interior, so that the efficiency of the melting is lowered. If the quantity of heat applied to the material should be increased to reduce the time required for the melting, the inner crucible would be subjected to excessive deformation.

In Japanese Patent Application First Publication "Kokai" No. 55-47300, there has been proposed an apparatus as shown in FIG. 5. The apparatus comprises the inner crucible 101 fixedly secured to a fixed portion 108 through a support 107. Such an apparatus, however, has the disadvantages that the inner crucible 101 cannot be rotated together with the outer crucible 102. For growing a single crystal ingot, the crucible must be generally rotated at a speed of 5 rpm to 10 rpm. Without such rotation, the formation of single crystals may be difficult.

In conjunction with the use of the double crucible, Japanese Patent Application First Publication "Kokai" No. 58-204895 discloses an apparatus which comprises a mechanism for causing the inner crucible to rotate and move upwardly and downwardly. The apparatus, however, has the drawbacks that it is large and complex in construction, thereby being high in cost.

SUMMARY OF THE INVENTION

Accordingly, an object of the present invention is to solve the above problems and to provide an apparatus and process for growing crystals of semiconductor materials by using a two-wall-type crucible which has an inner crucible and an outer crucible and in which the semiconductor material is supplied between the inner and outer crucible successively. In apparatuses for melting semiconductor material and growing single crystals of semiconductor material, the apparatus comprising:

(a) a furnace,
(b) a cylindrical double crucible assembly comprising an inner crucible in which single crystals of semiconductor material are grown at a vertical-concentric line thereof, the inner crucible having an upper part and a lower part, and an outer crucible in which melted semiconductor material is received, the outer crucible having the inner crucible disposed therein,
(c) a susceptor for supporting the outer crucible,
(d) rotating means for rotating the susceptor,
(e) a feed pipe for supplying starting material in the space formed between the inner and the outer crucibles,
(f) fluid-passage means for permitting the melted semiconductor material to flow between the inner and outer crucibles, the fluid-passage means being disposed at the lower part of the inner crucible, and (g) heating means disposed so as to surround the susceptor for heating the semiconductor material contained in the double crucible;

wherein the inner crucible being set inside the outer crucible in a separable manner, the apparatus improved comprising:

(h) joining means for setting the inner crucible inside the outer crucible concentrically, the joining means being disposed inside the furnace, and (i) engaging means for engaging the inner crucible and joining means detachably, the engaging means being disposed at the upper part of the inner crucible so as to engage a respective joining means.

According to a second aspect of the present invention, there is provided a process for melting semiconductor material and growing single crystals of the semiconductor material, the process comprising the steps of:

(a) providing a crystal-growing apparatus having a cylindrical double crucible comprising an inner crucible in which single crystals of the semiconductor material are grown at a concentric line therein, the inner crucible being contained in a separable manner in an outer crucible in which melted semiconductor material is received, a susceptor for supporting the outer crucible, a rotating means for rotating the susceptor, joining means for setting the inner crucible and the outer crucible concentrically, the joining means disposed inside a furnace, and engaging means for engaging the inner crucible with joining means detachably, the engaging means disposed at the upper part of the inner crucible so as to engage the engaging means with a respective joining means;

(b) raising the inner crucible by engaging the joining means with the respective engaging means of the inner crucible, so as to remove the inner crucible from the outer crucible;

(c) charging the outer crucible with semiconductor material;

(d) subsequently heating the outer crucible to thereby melt the semiconductor material in the outer crucible;

(e) subsequently moving downwardly joining means holding the inner crucible so as to couple the inner and outer crucibles concentrically;

(d) subsequently immersing a seed crystal in the melt in the inner crucible on the concentric line and withdrawing the seed crystal from the melt to thereby grow the semiconductor crystal.

DESCRIPTION OF PREFERRED EMBODIMENTS OF THE INVENTION

Figure 1:
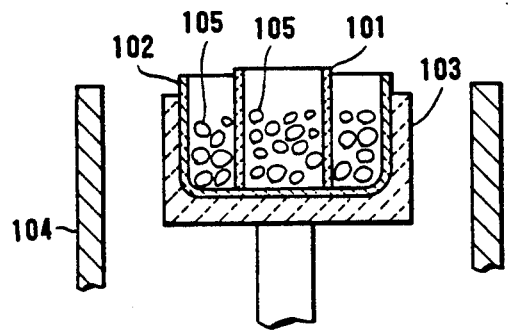
FIG. 1 is a schematic cross-sectional view showing a conventional crystal-growing apparatus.
Figure 2:
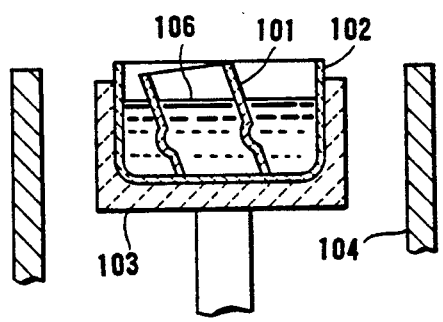
FIG. 2 is a view similar to FIG. 1, but showing how an inner crucible thereof is deformed after heating.
Figure 3:
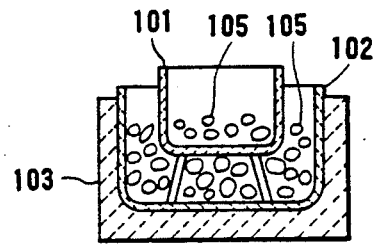
FIG. 3 is a schematic cross-sectional view showing another conventional crystal-growing apparatus.
Figure 4:
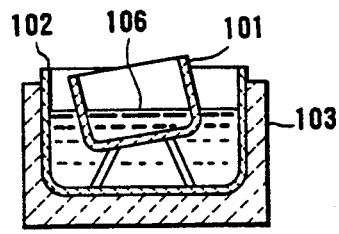
FIG. 4 is a view similar to FIG. 3, but showing how an inner crucible thereof is deformed after heating.
Figure 5:
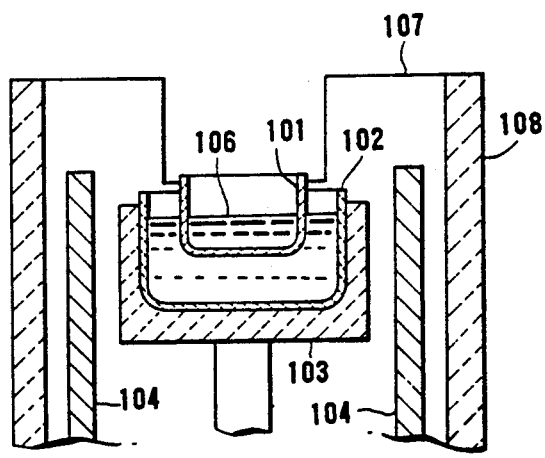
FIG. 5 is a cross-sectional view of a part of a third conventional crystal-growing apparatus.

Referring to FIGS. 6 to 11, there is illustrated an apparatus for growing single crystals of semiconductor materials according to the present invention.

The apparatus comprises a furnace 10 consisting of an upper part 10A and a lower part 10B, an outer crucible 13 made of quartz, an inner crucible 16 made of quartz, to be disposed detachably inside the outer crucible 13, a susceptor 12 made of graphite for supporting the outer crucible 13 fixedly, a shaft 11 fixed to the susceptor 12 thereupon for rotating the outer crucible 13 and moving it upwardly and downwardly, a heater 14 surrounding the susceptor 12, and a heat reserving shell 15 surrounding the heater 14. The inner crucible 16 is of a cylindrical shape smaller in diameter than the outer crucible 13, and includes a plurality of apertures of fluid passages 16A formed therethrough and disposed adjacent to its lower end. Such apparatuses 16A permit the flow of molten material toward and away from the inner crucible 16, from and to an annular volume defined between the peripheral walls of the outer and inner crucibles 13 and 16. The inner crucible is also preferably open at a bottom thereof. A pair of engaging members 17 made of quartz are disposed outwardly on the opposite side of the upper peripheral part of the inner crucible 16. A feed pipe 18 for supplying starting silicon materials between the inner crucible 16 and the outer crucible 13 is inserted into the furnace 10 from the outside thereof. A drive mechanism (not shown) for pulling and rotating a wire for retaining a seed crystal is provided above the furnace 10. The wire must be concentric with both the inner and outer crucibles.

Figure 8:
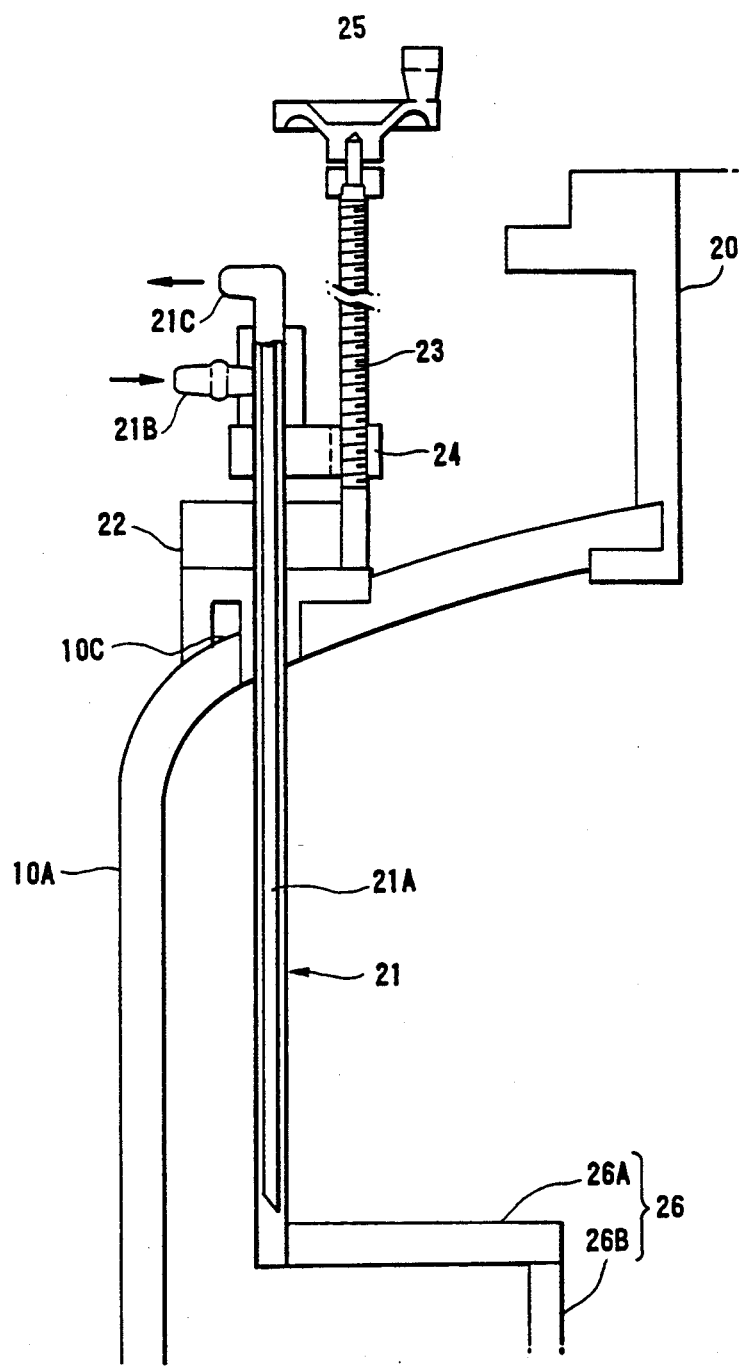
FIG. 8 is a vertical cross-sectional view of a mechanism to move the inner crucible upwardly and downwardly.

The upper part 10A of the furnace 10 is fixed to the lower part 10B at one end thereof and fixed to a cylindrical insert part 20 for pulling the wire at the other end thereof. A pair of hollow rods 21 made of stainless steel are set vertically through a shoulder part 10C of the upper part 10A. Each hollow rod 21 is supported by an airtight and air-cooled seal 22 so that the hollow rod 21 can be moved upwardly and downwardly. As shown in FIG. 8, a stainless steel pipe 21A is inserted into the hollow rod 21. Cooled water is supplied from an inlet nozzle 21B disposed between the hollow rod 21 and the pipe 21A, passes through the pipe 21A upwardly, and is then drawn off outside from an outlet nozzle 21C connected to the pipe 21A.

In addition, a screw shaft 23 for moving the inner crucible 16 upwardly and downwardly is set parallel to each hollow rod 21 by a shaft receiver 24 and supported by a supporting plate 23A attached to the shoulder part 10C of the furnace 10. The screw shaft 23 has an exterior threaded portion and the shaft receiver 24 has an interior threaded portion engaged with the exterior threaded portion of the screw shaft 23. On an upper end of the screw shaft 23, a handle 25 for rotating the screw shaft 23 is fixed so that each hollow rod 21 can be moved upwardly and downwardly by rotating the handle 25.

A lower end portion of each hollow rod 21 is fixed to a horizontal part 26A of a holder joining member 26 for setting the inner crucible 16 in the outer crucible 13 concentrically and a vertical part 26B fixed to the horizontal part 26A at one end thereof is fixed to a holder 27 for holding the engaging member 17 of the inner crucible 16. The feed pipe 18 is disposed so that the pipe 18 does not disturb the holder joining member 26. As the material of the holder joining member 26, a heat resistant simplex such as Mo, Ta, W, C, SiC, or the like, or a composite material, is applied. Furthermore, a coating layer made of SiC or the like is disposed on the surface of the holder joining member 26, if necessary.

Figure 10:
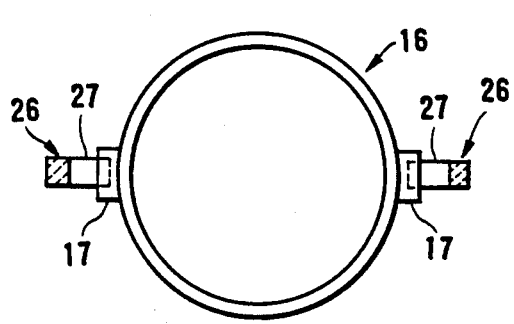
FIG. 10 is a plan view showing how engaging members engage with holders connected to holder joining members.
Figure 11:
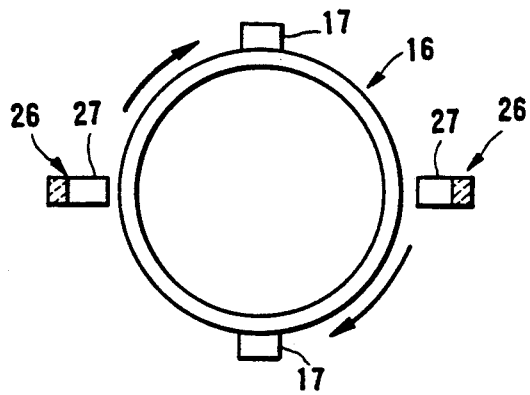
FIG. 11 is a view similar to FIG. 10, but showing the inner crucible removed from the outer crucible.

As shown in FIGS. 10 and 11, the pair of holders 27 fixed to the pair of holder joining members 26 respectively are disposed at a distance shorter than the distance between outer ends of the pair of engaging members 17 and longer than the outside diameter of the inner crucible 16. In order to move the inner crucible 16 upwardly, each engaging member 17 is set so as to meet each holder 27 respectively as shown in FIG. 10 and the handle 25 is rotated so as to move the screw shaft 23 upwardly. In order to remove each holder 27 from each engaging member 17, the shaft 11 indirectly connected to the outer crucible 13 is rotated in the condition of the inner crucible 16 being held in the outer crucible 13 as shown in FIG. 11. There must be friction between the surfaces of engaging member 17 and the holder 27 so as not to separate them when the inner crucible 16 is moved upwardly and downwardly. A concave-convex mechanism may be applied between each engaging member 17 and each holder 27.

Next, a process for using the apparatus of the present invention will be shown.

Figure 6:
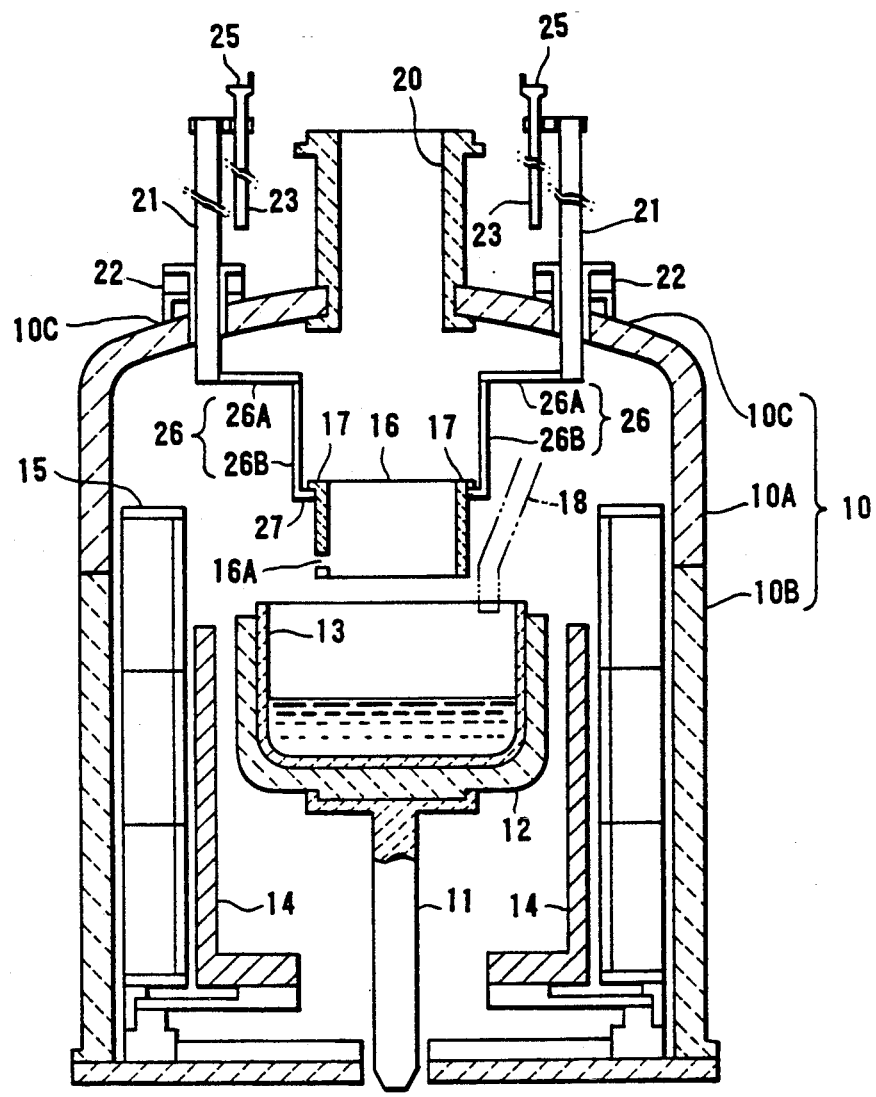
FIG. 6 is a vertical cross-sectional view of a crystal-growing apparatus provided in accordance with a first embodiment of the present invention in a condition that an inner crucible is removed from an outer crucible.
Figure 7:
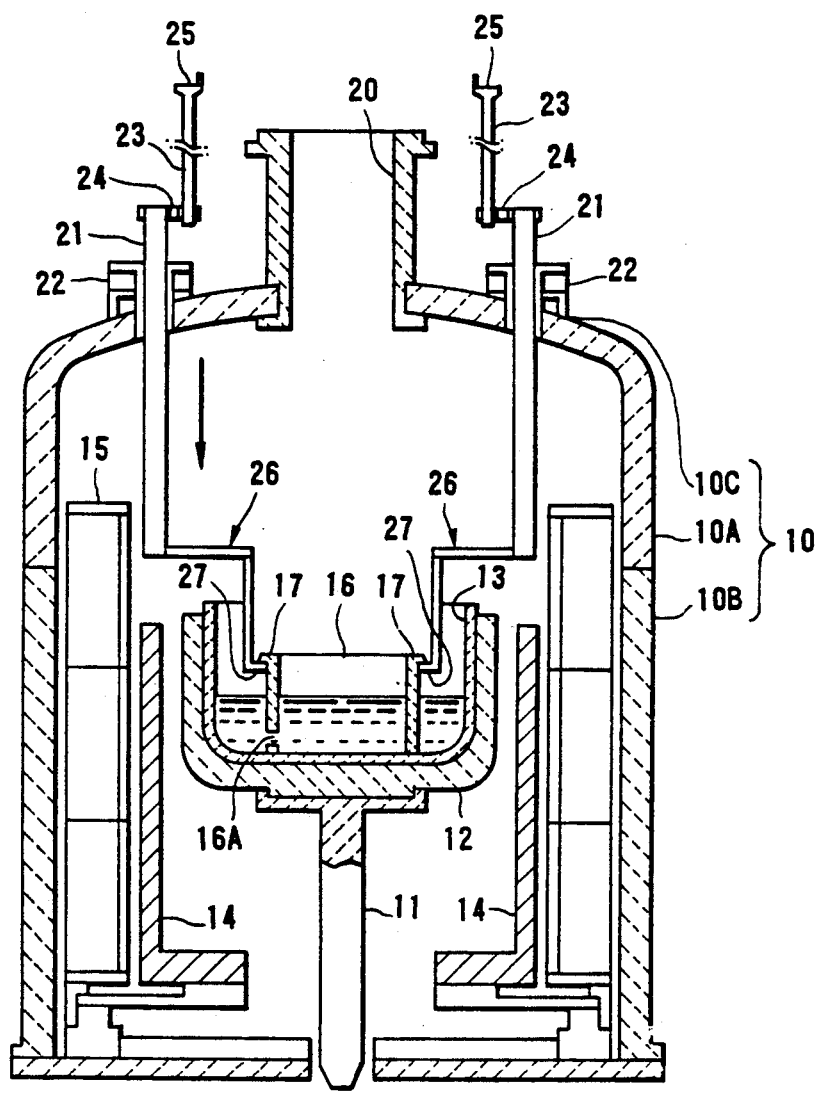
FIG. 7 is a view similar to FIG. 6, but showing a set position where an inner crucible is set in an outer crucible.
Figure 9:
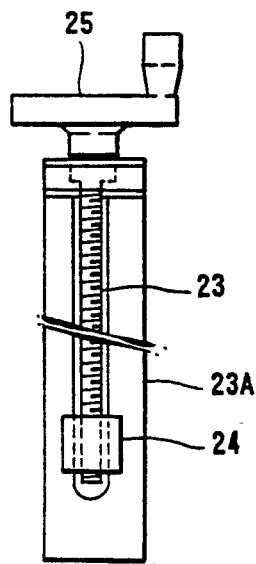
FIG. 9 is a side view of a part of the mechanism shown in FIG. 8.

In the condition that the inner crucible 16 is released from the outer crucible 13 as shown in FIG. 6, the starting silicon material of silicon is charged in the outer crucible 13 from the feed pipe 18 under an argon atmosphere by injecting argon gas from the insert part 20 into the furnace 10 and the heater 14 is turned on after the position of the outer crucible 13 is set by adjusting the shaft 11 connected to the susceptor 12.

After the starting silicon material contained in the outer crucible 13 is dissolved, the inner crucible 16 is moved downwardly by rotating the handle 25 so that the inner crucible 16 and the outer crucible 13 are fitted in an appropriate position so that both crucibles are positioned concentrically. Each engaging member 17 of the inner crucible 16 is released from each holder 27 by rotating the shaft 11 connected to the susceptor 12 fixed to the outer crucible 13 including the inner crucible 16 at a 90° angle. The holder 27 is lifted by rotating the handle 25 so as to move the screw shaft 23 connected indirectly to the holder 27 upwardly. The growing of a single crystal ingot is begun in a usual manner when starting the melt of the silicon material.

As described above, in the apparatus in accordance with the present invention, the inner crucible 16 is released from the outer crucible 13 when the silicon starting material is melted at a high temperature, so that the inner crucible 16 is prevented from excessive deformation by heat and the effectiveness of melting the starting material is greater than in the inner crucible 16. Therefore, the time required for the melting can be reduced substantially, thereby enhancing the productivity markedly.

Furthermore, as the inner crucible 16 is moved to the prescribed position in the outer crucible 13, the crucibles are worked and rotated as a double crucible. Therefore, a silicon single-crystal having a uniform quality can be grown smoothly and the apparatus according to the present invention is simple in construction and is easily serviced.

When growing a silicon single crystal, the holder joining member 26 and the holder 27 are released upwardly from the double crucible by using the screw shaft 23 which is connected to them indirectly. Therefore, there are the advantages such that the holder joining member 26 does not meet the feed pipe 18 and that the pieces of the starting silicon materials striking the holder joining member 26 cause the growing single-crystal to break. Furthermore, the inner crucible 16 can be removed the upper inside of the furnace 10, so that the deformation of the inner crucible 16 by heat is smaller than in the case where the holder joining member 26 and the holder 27 are fixed to the furnace 10. The outer crucible 13 is set in an appropriate position by adjusting the shaft 11 when the starting silicon material filled in the outer crucible 13 is heated and melted. Accordingly, a good position of the outer crucible 13 can be selected so that the effectiveness of melting the starting material is optimal.

Figure 12:
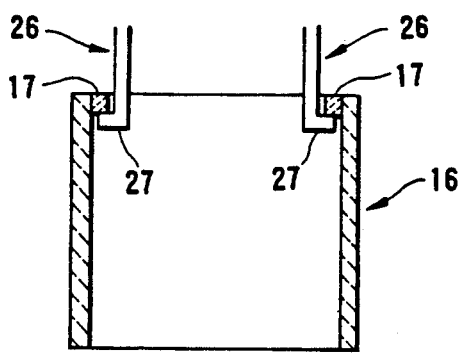
FIG. 12 is a schematic cross-sectional view of a part of a modified apparatus in accordance with the present invention.
Figure 13:
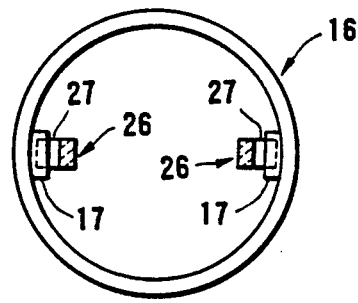
FIG. 13 is a plan view of the same apparatus as shown in FIG. 12.
Figure 14:
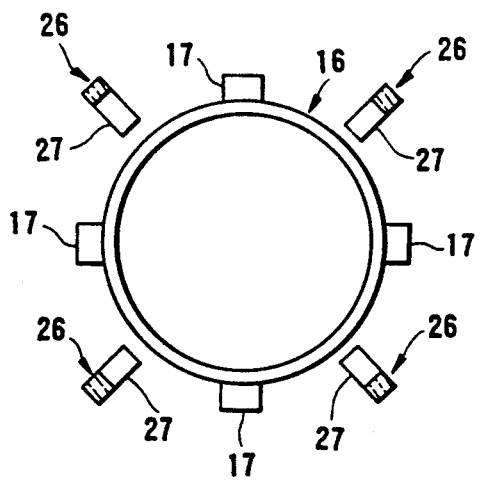
FIG. 14 is a plan view of a part of another modified apparatus in accordance with the present invention.
Figure 15:
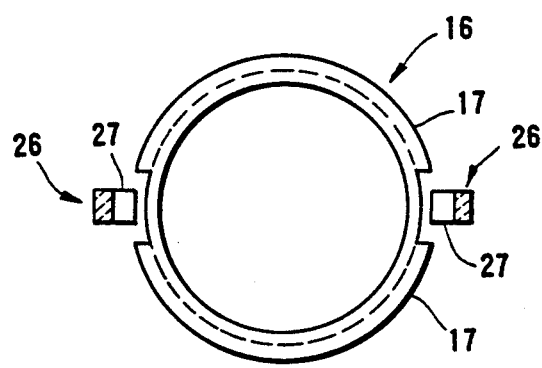
FIG. 15 is a plan view of a part of a third modified apparatus in accordance with the present invention.

While the present invention has been specifically shown and described herein, many modifications and variations are possible in the light of the above teachings. For example, although in the above embodiment, each holder 27 holds each engaging member 17 of the inner crucible 16 radially-inwardly outside of the inner crucible 16, the holder 27 may hold the engaging member 17 radially-outwardly inside of the inner crucible 16 as shown in FIGS. 12 and 13. In addition, as schematically shown in FIG. 14, two pairs of engaging members 17 of the inner crucible 16 may be utilized instead of a pair of engaging members 17 shown in FIG. 11. Two pairs of holders 27, each holder 27 connected to the holder joining member 26, are needed so that each holder meets each engaging member 17. In this case, the apparatus has an advantage in that the inner crucible 16 can be moved upwardly and downwardly while horizontally stable. When each engaging member 17 is lengthened circumferentially and the rim of the inner crucible 16 is expanded into a flange as shown in FIG. 15, the rim of the inner crucible 16 is strengthened so as to be less deformable.

Figure 16:
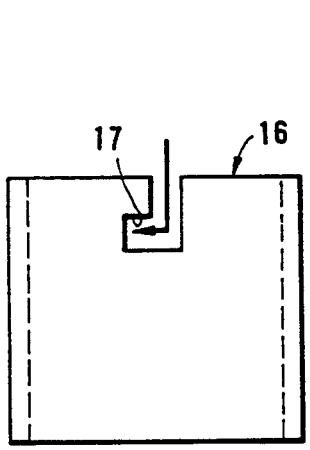
FIG. 16 is a side view of a part of a fourth modified apparatus in accordance with the present invention.
Figure 17:
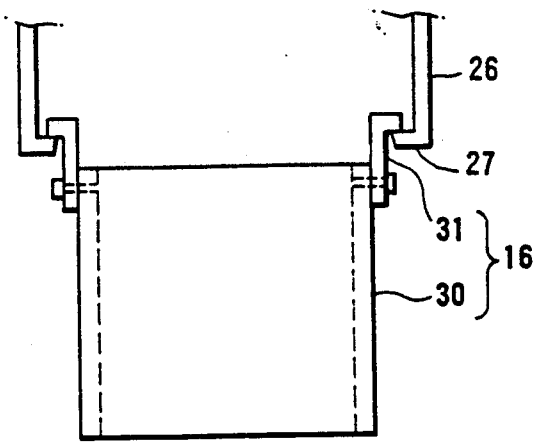
FIG. 17 is a side view of a part of a fifth modified apparatus in accordance with the present invention.

In addition, an engaging member 17 is made by cutting the upper part of the inner crucible 16 to form an L-shaped or T-shaped gutter or concavity as shown in FIG. 16. Furthermore, an inner crucible 16 comprises a cylindrical member 30 made of quartz and a pair of reverse-L-shaped engaging members 31 made of heat-resistant material fixed to the upper part of the cylindrical member 30 detachably by bolts. In this case, although the cylindrical member 30 is disposable after use, the engaging members 31 can be reused. Therefore, the cost of the apparatus is reduced.

Figure 18:
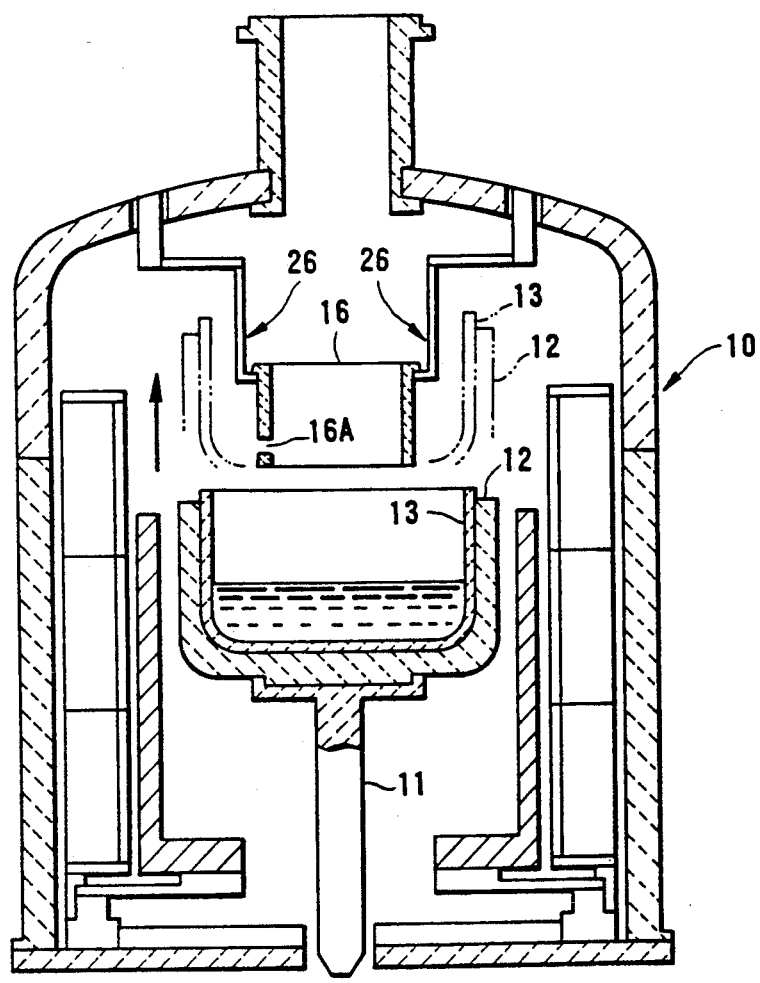
FIG. 18 is a vertical cross-sectional view of a sixth modified apparatus in accordance with the present invention.
Figure 19:
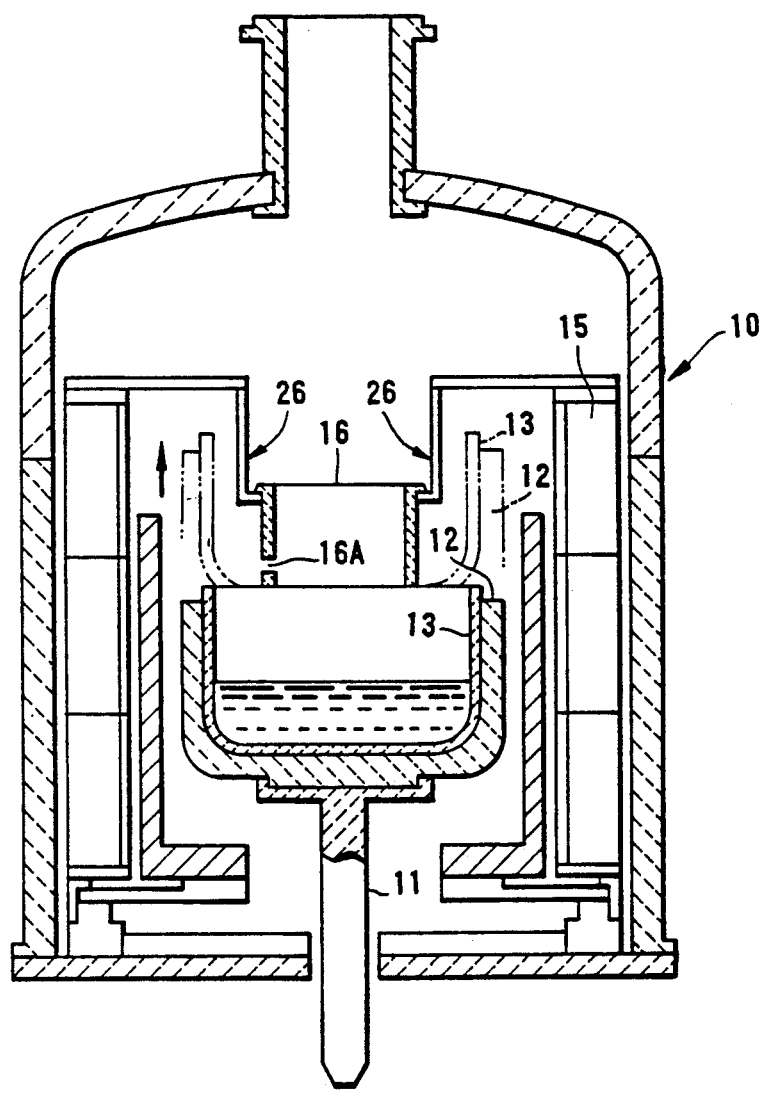
FIG. 19 is a vertical cross-sectional view of a seventh modified apparatus in accordance with the present invention.

Furthermore, a holder joining member 26 may be fixed to the furnace 10, as shown in FIG. 18, or it may be fixed to each upper end of the heat-reserving shell 15 as shown in FIG. 19. The outer crucible 13 is moved upwardly until fitting to the inner crucible 16 to comprise a double crucible, and the double crucible is rotated to release the inner crucible 16 from the holder joining member 26. These apparatuses are simpler than the apparatus having a mechanism of moving the holder joining member 26.

Figure 20:
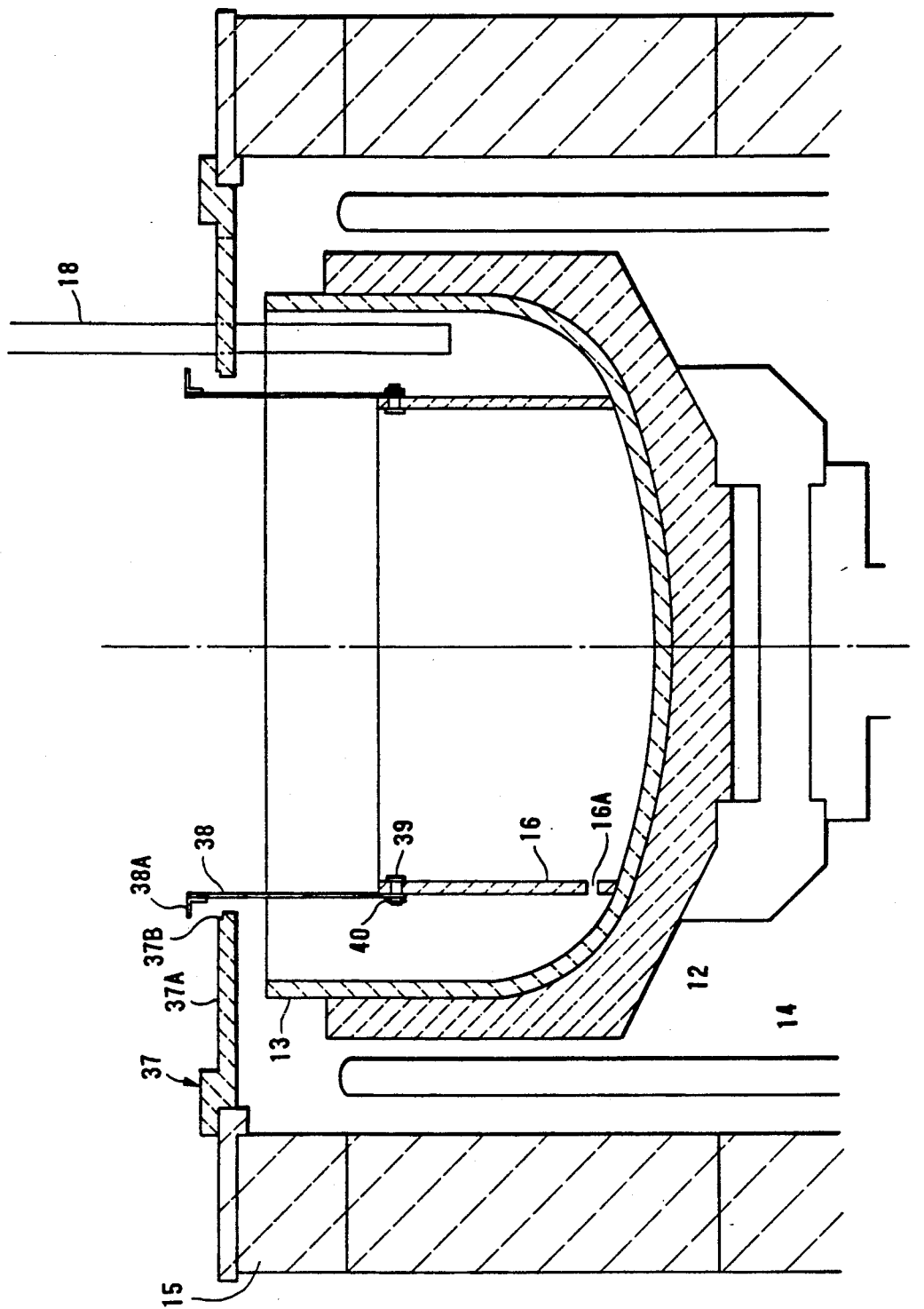
FIG. 20 is a vertical cross-sectional view of an eighth modified apparatus in accordance with the present invention.
Figure 21:
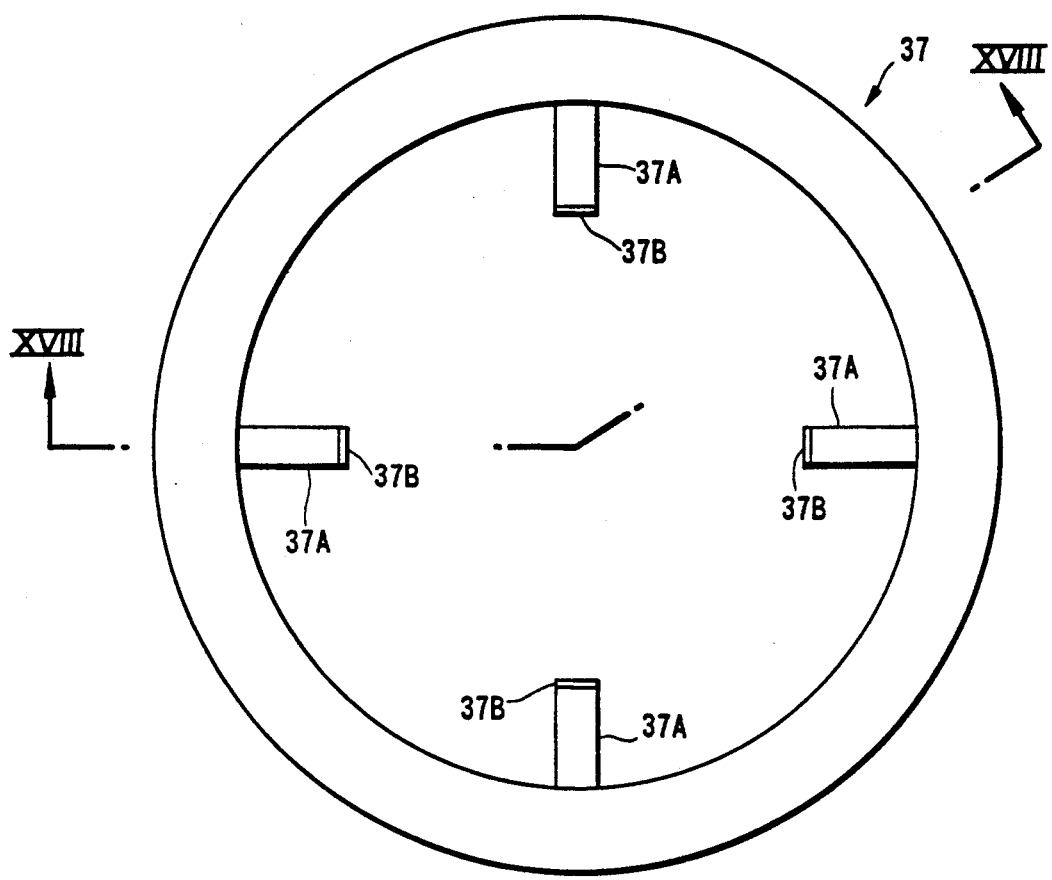
FIG. 21 is a plan view of a joining ring for joining an inner crucible of the apparatus shown in FIG. 20.
Figure 22:
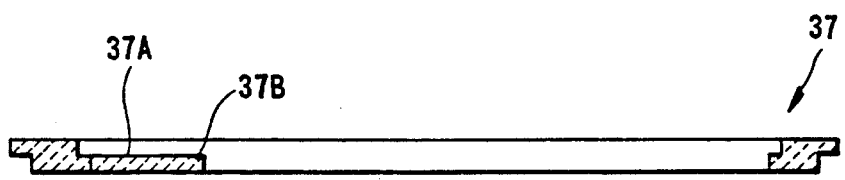
FIG. 22 is a vertical cross-sectional view of the ring cut along the arrows XVII—XVII.

An applied apparatus is shown in FIG. 20. This apparatus has a joining ring 37 fixed horizontally to the heat-reserving shell 15. As best shown in FIGS. 21 and 22, the joining ring 37 has four plate-shaped engaging portions 37A extended radially-inwardly at every 90° angle of the circumference of the joining ring 37. The material of the joining ring 37 is the same as the holder joining member 26 described above. Four long plate-shaped joining members 38 are fixed to the upper end of the inner crucible 16 at every 90° angle of the circumference of the upper end of the inner crucible 16 by using bolts 39 and nuts 40 made of Mo. The material of the joining member 38 is the same as the holder joining member 26 described above. At the upper end of each joining member 38, a hanging member 38A is disposed horizontally radially outward of the inner crucible 16. At the upper and inner circumference of each engaging portion 37A of the joining ring 37, a tapered part 37B is disposed. Each tapered part 37B is engaged with the respective hanging member 38A when the outer crucible is moved upwardly. In this apparatus, the operations are the same as those in the apparatus shown in FIGS. 18 and 19.

What is claimed is:

1. An apparatus for melting semiconductor material and growing single crystals of semiconductor material, the apparatus comprising:
   (a) a furnace,
   (b) a cylindrical double crucible assembly comprising
      a) an inner crucible open at a bottom thereof, in which single crystals of semiconductor material are grown, the inner crucible having side walls and being bottomless, and b) an outer crucible having a bottom in which melted semiconductor material is received, the outer crucible having the inner crucible disposed in contact with said outer crucible bottom in a separable manner,
   (c) a susceptor for supporting the outer crucible,
   (d) rotating means for rotating the susceptor,
   (e) a feed pipe for supplying starting material in the space formed between the inner and outer crucibles,
   (f) fluid-passage means for permitting the melted semiconductor material to flow between the inner and outer crucibles, the fluid-passage means being disposed at the lower part of the inner crucible,
   (g) heating means disposed to surround the susceptor for heating the semiconductor material in the double crucible,
   (h) at least two joining means for concentrically setting the inner crucible inside the outer crucible inside the furnace, said joining means being disposed at least at two circumferential locations relative to the inner crucible, separated by circumferential intervals,
   (i) engaging means coupled to said inner crucible at an upper end of said side walls, for detachably engaging with each said joining means at the upper end of the inner crucible, said inner crucible being adapted to operate with said joining means detached, and
   (j) drive means for providing vertical movement of either said inner or outer crucible.

2. A semiconductor crystal growing apparatus according to claim 1, wherein said drive means moves the joining means vertically inside the furnace between a coupled position in which the inner crucible is inside the outer crucible and a removed position in which the inner crucible is separated from the outer crucible.

3. A semiconductor crystal growing apparatus according to claim 1 or claim 2, wherein the inner crucible is composed of quartz and joining means are composed of heat-resistant materials.

4. An apparatus for melting semiconductor material and growing single crystals of semiconductor material according to claim 1, wherein the fluid passage means is an orifice formed in a lower part of the side walls of the inner crucible.

5. An apparatus for melting semiconductor material and growing single crystals of semiconductor material according to claim 1, wherein the fluid passage means is a hole formed in a lower part of the side walls of the inner crucible.

6. An apparatus for melting semiconductor material and growing single crystals of semiconductor material according to claim 1, wherein the fluid passage means is a notch formed in a lower edge of the side walls of the inner crucible.

* * * * *